(12) United States Patent
Schlarmann et al.

(10) Patent No.: US 9,103,845 B2
(45) Date of Patent: Aug. 11, 2015

(54) SYSTEM AND METHOD FOR REDUCING OFFSET VARIATION IN MULTIFUNCTION SENSOR DEVICES

(71) Applicant: Freescale Semiconductor, Inc., Austin, TX (US)

(72) Inventors: Mark E. Schlarmann, Chandler, AZ (US); Deyou Fang, Chandler, AZ (US); Keith L. Kraver, Gilbert, AZ (US); Mike A. Margules, Austin, TX (US); Hiroto Sahara, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 293 days.

(21) Appl. No.: 13/791,329

(22) Filed: Mar. 8, 2013

(65) Prior Publication Data

US 2014/0251009 A1     Sep. 11, 2014

(51) Int. Cl.
*G01C 19/56*  (2012.01)
*B81B 5/00*  (2006.01)
*B81B 7/02*  (2006.01)
*G01C 19/5776*  (2012.01)

(52) U.S. Cl.
CPC ... *G01P 9/04* (2013.01); *B81B 5/00* (2013.01); *B81B 7/02* (2013.01); *G01C 19/5776* (2013.01); *B81B 2201/0242* (2013.01); *B81B 2201/0264* (2013.01); *B81B 2207/03* (2013.01)

(58) Field of Classification Search
CPC .............. G01C 19/56; G01C 19/5719; G01C 19/5607; G01C 19/5649; G01C 19/5642; G01C 19/5776; G01P 1/023; G01P 1/02; G01P 15/08; G01P 15/0802

USPC ................ 73/504.12, 504.04, 510, 511, 493, 73/504.14
See application file for complete search history.

(56) References Cited

U.S. PATENT DOCUMENTS

| | | | |
|---|---|---|---|
| 5,404,363 A * | 4/1995 | Krause et al. ............... | 714/814 |
| 6,101,864 A | 8/2000 | Abrams et al. | |
| 6,539,799 B1 * | 4/2003 | Handrich et al. ............ | 73/493 |
| 7,980,135 B2 | 7/2011 | Prandi et al. | |
| 8,156,805 B2 | 4/2012 | Hayner et al. | |
| 8,577,633 B2 * | 11/2013 | Patel .............................. | 702/72 |

(Continued)

OTHER PUBLICATIONS

Costlow, Lynn E.,"A MEMS Gyro for the Harsh Engine Compartment Environment", Apr. 1, 2007, printed from http://www.sensorsmag.com/automotive/a-mems-gyro-harsh-engine-compartment-environment-1353 (5 pages).

*Primary Examiner* — Helen Kwok
(74) *Attorney, Agent, or Firm* — Ingrassia Fisher & Lorenz, P.C.

(57) ABSTRACT

Systems and methods are provided for improved multifunction sensing. In these embodiments a multifunction sensing device (100) includes a microelectromechanical (MEMS) gyroscope (110) and at least a second sensor (112). The MEMS gyroscope (110) is configured to generate a first clock signal, and the second sensor includes a second clock signal. The multifunction sensing device further includes a reset mechanism (114), the reset mechanism (114) configured to generate a reset signal to set the relative periodic phase alignment of the second clock signal to the first clock signal. Consistently setting the relative periodic phase alignment of the clocks for the other sensor devices (112) to the clock of the MEMS gyroscope (110) can improve the performance of the devices by reducing the probability that varying output offsets will occur in the multiple sensing devices.

20 Claims, 5 Drawing Sheets

(56) References Cited

U.S. PATENT DOCUMENTS

| | | | |
|---|---|---|---|
| 2006/0016260 A1* | 1/2006 | Smith | 73/504.03 |
| 2007/0250261 A1* | 10/2007 | Soehren | 701/207 |
| 2008/0234935 A1* | 9/2008 | Wolf et al. | 701/216 |
| 2009/0007661 A1* | 1/2009 | Nasiri et al. | 73/504.03 |
| 2011/0146402 A1 | 6/2011 | Donadel et al. | |
| 2011/0192226 A1 | 8/2011 | Hayner et al. | |
| 2011/0197674 A1* | 8/2011 | Prandi et al. | 73/504.12 |
| 2012/0023354 A1* | 1/2012 | Chino | 713/323 |
| 2012/0235726 A1* | 9/2012 | Elsayed et al. | 327/299 |
| 2013/0312520 A1* | 11/2013 | Kho | 73/504.12 |

* cited by examiner

SYSTEM AND METHOD FOR REDUCING OFFSET VARIATION IN MULTIFUNCTION SENSOR DEVICES

TECHNICAL FIELD OF THE INVENTION

The present invention relates generally to microelectromechanical systems (MEMS) devices. More specifically, the present invention relates to multifunction MEMS sensor devices.

BACKGROUND OF THE INVENTION

Microelectromechanical systems (MEMS) technology has achieved wide popularity in recent years, as it provides a way to make very small electro-mechanical structures using conventional batch semiconductor processing techniques. One common application of MEMS is the design and manufacture of sensor devices. MEMS sensors are widely used in applications such as automotive, inertial guidance systems, household appliances, game devices, protection systems for a variety of devices, and many other industrial, scientific, and engineering systems.

One example of a MEMS sensor is a MEMS gyroscope. Alternatively referred to as a "angular rate sensor," "gyroscope," "gyrometer," "vibratory gyroscopes," "gyroscope sensor," or "yaw rate sensor," a MEMS gyroscope senses angular rotation or velocity around one or more axes. MEMS gyroscopes are widely used in a variety of sensing applications. For example, vehicle or automotive applications may use MEMS gyroscopes, to determine when to deploy the vehicle airbag or activate a stability and/or traction control system. In addition, consumer electronics devices, such as video game controllers, personal media players, cell phones, and digital cameras, also use MEMS gyroscopes in various applications to track the orientation and/or respond to rotational movement of the device.

Other examples of MEMS sensor devices include MEMS inertial sensors and MEMS pressure sensors. In general, MEMS inertial sensors can be constructed and configured to sense various different types of inertial changes, including acceleration. Likewise, MEMS pressure sensors can be configured to sense various types of pressure changes.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
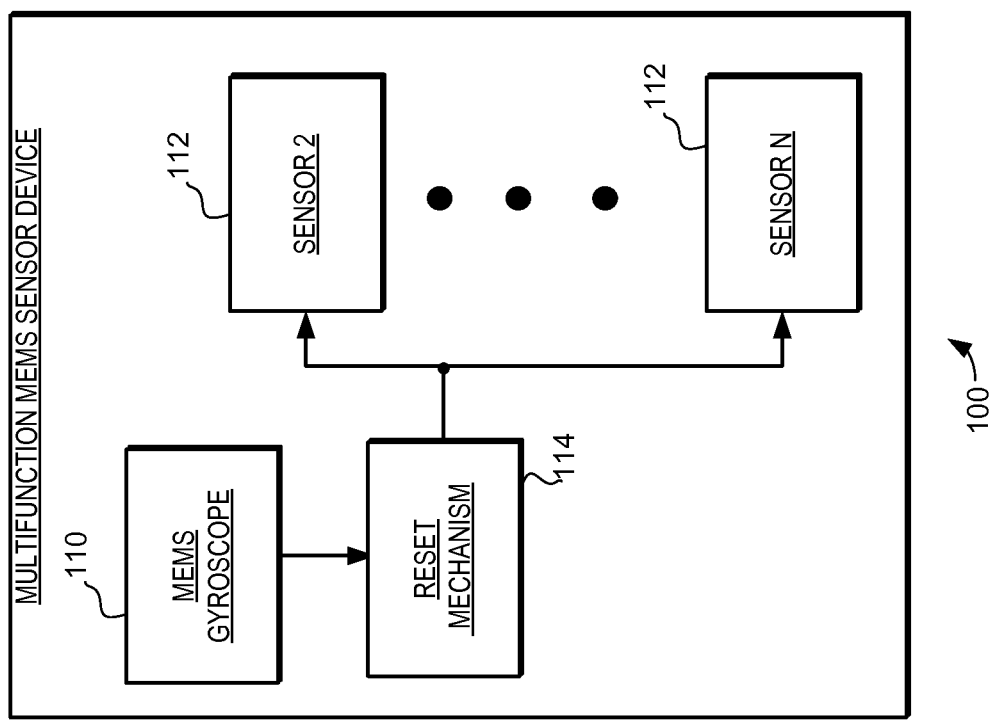
FIG. 1 is a schematic view of a multifunction sensing device in accordance with an embodiment of the invention.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

The following description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter.

For the sake of brevity, conventional techniques related to microelectromechanical systems (MEMS) fabrication and development, MEMS sensing, analog circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof. In addition, certain terminology may also be used in the following description for the purpose of reference only, and thus are not intended to be limiting, and the terms "first", "second" and other such numerical terms referring to structures do not imply a sequence or order unless clearly indicated by the context.

The various embodiments described herein provide systems and methods for providing improved multifunction sensing. In these embodiments a multifunction sensing device includes a microelectromechanical (MEMS) gyroscope and at least a second sensor. The MEMS gyroscope is configured to generate a first clock signal, and the second sensor includes a second clock signal. The multifunction sensing device further includes a reset mechanism, the reset mechanism configured to generate a reset signal to align the relative periodic phase of the second clock signal to the first clock signal. As will be described in greater detail below, aligning the relative periodic phases of the clocks for the other sensor devices to the clock of the MEMS gyroscope can improve the performance of the devices by reducing the probability that varying output offsets will occur in the multiple sensing devices.

In a specific embodiment a multifunction sensing device includes a reset mechanism, a MEMS gyroscope and at least a second MEMS sensor and a third MEMS sensor. In this embodiment the first MEMS sensor and the second MEMS sensor are both selected from the group consisting of a MEMS inertial sensor and a MEMS pressure sensor. The MEMS gyroscope is configured to generate a first clock signal phase aligned to at least a sub-harmonic of the mechanical oscillation of the vibrating mass in the MEMS gyroscope. The second MEMS sensor includes a second clock signal and the third MEMS sensor includes a third clock signal. The reset mechanism is configured to receive the first clock signal and a reset request signal. The reset mechanism is configured to generate a reset signal subsequent to an edge of the first clock signal in response to receiving the reset request signal, where the reset signal is coupled to the second MEMS sensor and the third MEMS sensor to cause the second clock signal and the third clock signal to phase align with the first clock signal. Specifically, to set the relative periodic phase alignment between the second clock signal, the third clock signal, and the first clock signal. Again, as will be described in greater detail below, setting a consistent relative periodic phase alignment between the clocks for the other MEMS sensor devices to the first clock of the MEMS gyroscope can improve the performance of the devices by reducing the probability that varying output offsets will occur in the multiple MEMS sensing devices.

Sensor devices such as MEMS sensors typically have what is generally referred to as an "offset". In general, offset refers to the sensor output that is generated when a null or zero input is applied to the sensor. These offsets can arise from a variety of factors, including the typical variations in manufacturing and calibration that occur during MEMS sensor fabrication. Most sensor devices, including most MEMS sensor devices, provide mechanisms to compensate for or otherwise "zero out" such offsets such that they do not unacceptably alter the sensor output during operation. For example, a MEMS sensor device may include programmable "trimming values" that allow the offset to be reduced, eliminated, or otherwise compensated for during device set up. The process of programming such values to reduce or eliminate offsets is commonly referred to as "trimming".

However, such techniques have limited effectiveness in dealing with offsets that vary or can otherwise change during or between sensing operations. One such type of variable offset that occurs in multifunction sensor devices is generally referred to as "multimodal offset". Multimodal offset can occur in multifunction sensor devices due to the interactions between the multiple devices. These interactions between devices can include shared power or return paths, thermal coupling, electromagnetic coupling, mechanical coupling, and shared circuitry. These interactions can be particularly strong when the MEMS sensor devices formed on the same substrate with the MEMS gyroscope. The result of these interactions is that the multifunction MEMS sensor device can have offsets that vary stochastically among several different values. For example, offsets that can change from power-up to power-up, with values that vary randomly among a discrete set of values are referred to as multimodal. Because trimming only compensates for one possible set of offset values it has limited effectiveness in compensating for multimodal offsets that may vary from power-up to power-up. That is, if a device is trimmed for one offset value, and a multimodal change results in a different offset values, errors in reported sensor values can result. These errors can negatively impact the accuracy of the device.

The various embodiments described herein provide systems and methods for reducing multimodal offsets and thus improving performance in multifunction sensing. The techniques reduce the likelihood of multimodal offsets by eliminating the relative phase variation between the clocks in the gyroscope and the clocks in the other sensor devices.

Typical MEMS gyroscopes employ a small vibrating mass which is driven to resonate within a two-dimensional plane, i.e., the plane of oscillation. When the plane of oscillation is rotated, the Coriolis force causes the vibrating mass to be displaced from the plane of oscillation by an amount proportional to the rate of rotation. In order to determine the rate of rotation, this displacement is measured and converted into an electrical signal which oscillates with the same resonant frequency as the vibrating mass. An in-phase component of this electrical signal is proportional to the rate of rotation, and is generally referred to as the rate signal or rate component. The rate signal can thus be used to provide data regarding the rate of rotation of the gyroscope.

Typical MEMS gyroscopes include at least one clock signal that is in phase with the mechanical oscillation of the vibrating mass. This can be accomplished through the use of a phase-locked-loop (PLL) that is used to phase-lock the clock signal to the mechanical oscillation. It should be noted that the phase of this mechanical oscillation itself cannot be easily changed due to the high quality factor and long time constant of the resonator used to drive the vibration of the mass. For this reason, the phase of the MEMS clock signal cannot be easily changed, and thus the embodiments described herein align the relative periodic phases of the other MEMS sensor device clocks to a MEMS gyroscope clock that is phase-locked with displacement (or a sub-harmonic of a clock that is phase-locked to displacement), and not vice versa.

Figure 5:
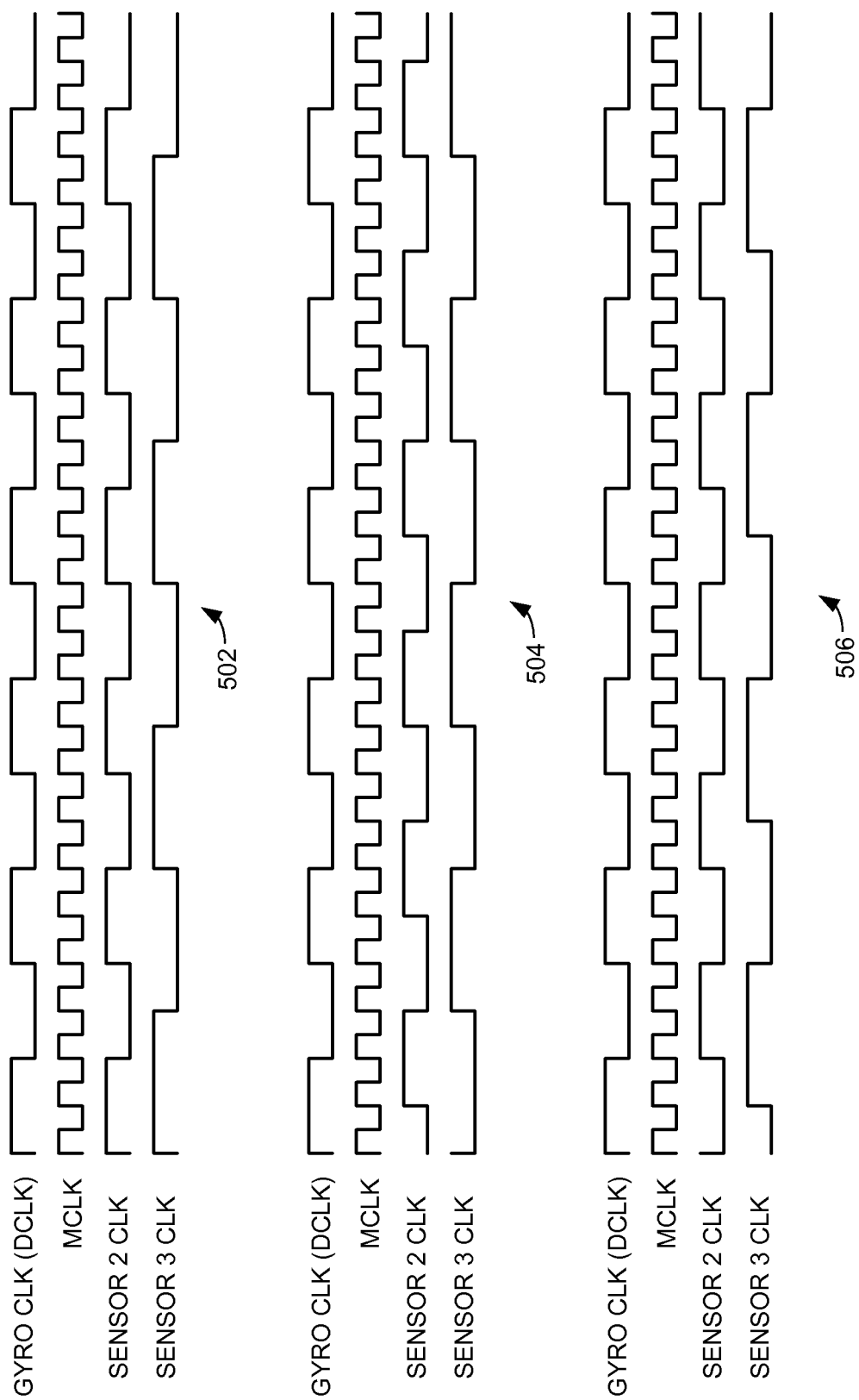
FIG. 5 is a timing diagram illustrating exemplary timing waveforms of various clocks in a multifunction sensor device.

Turning now to FIG. 5, three graphs 502, 504 and 506 illustrate exemplary clocks in a multifunction sensing device. Specifically, each graph 502, 504 and 506 illustrates a gyroscope clock (DCLK) that is phase aligned with displacement in gyroscope. Each graph also illustrates a high speed master clock (MCLK) and a second sensor clock and a third sensor clock. As will be illustrated in greater detail below, in typical implementations the high speed clock master clock MCLK is generated by the gyroscope and is passed to the other sensors where it is used to generate other clocks in those other sensors. Because these clocks are all generated using the same high speed master clock (MCLK) the entire system will be synchronous. However, because the various sensor clocks are generated independently of each other and the gyroscope displacement clock there can be variations in the relative periodic phase alignment between these clocks. And as described above, variations in relative phase alignments lead to multimodal output offsets for which trimming may not be effective. Examples of these variations in relative phase are shown in the differences between graphs 502, 504 and 506. Specifically, these graphs show how different relative periodic phase alignments between the gyroscope clock and the sensor clocks can occur even when they are all synchronous with the high speed master clock. In each case the various sensor clocks have different relative periodic phase relationships between each other and the gyroscope displacement clock, and could thus lead to different output offsets.

The various embodiments described herein reduce output offset variation by ensuring consistent relative phase relationships between clocks in the gyroscope and the clocks in the other sensor devices. Specifically, by aligning the relative periodic phases of the clocks used in the additional MEMS sensors to a first clock in the MEMS gyroscope that is phase-locked with displacement or a sub-harmonic of displacement in the MEMS gyroscope.

It should be noted that the setting of relative periodic phase alignment between these clocks signals does not imply that the frequencies of these clocks are the same. Thus, in this application the phrases "periodic phase alignment" and "setting relative periodic phase alignment" do not imply that the frequencies of the clocks are the same. Instead, setting the relative periodic phase alignment simply insures that the various clocks always have the same relative periodic phase relationship and does not switch between different phase relationships when the device is restarted. For example, in some embodiments the various clocks would always have the relative periodic phase alignment shown in graph 502, and would not randomly switch to the phase alignments of graph 504 and 506 at later startups. Thus, the clock signals would only be periodically phase aligned as the different clock frequencies requires, but have a consistent relative periodic phase alignment according to the meaning of the phrase in this application.

Turning now to FIG. 1, a simplified schematic view of a multifunction sensing device 100 is illustrated. The sensing device 100 includes a MEMS gyroscope 110, at least a second sensor 112 (illustrated as sensors 2 to N in FIG. 1) and reset mechanism 114. The reset mechanism 114 is configured to facilitate aligning the relative periodic phase(s) of the clock signal(s) of the second sensor(s) 112 to a first clock signal of the MEMS gyroscope. In a typical implementation the reset mechanism 114 can be implemented with one or more digital logic circuits, but other implementations may be possible. The reset mechanism 114 is configured to facilitate the consistent setting of relative periodic phase alignment between the clock signal(s) of the second sensor(s) 112 and the first clock signal of the MEMS gyroscope. As was described above, setting the relative periodic phase alignment for the clocks of the other sensors 112 to the clock of the MEMS gyroscope 110 can improve the performance of the combined multifunction sensor device by reducing the probability that varying output offsets will occur. In one specific embodiment the other sensors 112 comprise a MEMS inertial sensor and/or a MEMS pressure sensor. However, it should be noted that these are just examples, and that other sensors (including non-MEMS sensors) may be utilized in the multifunction sensor device 100 and that these other sensors may also include clock signals that may have their relative periodic phases aligned to the first clock signal by the reset mechanism 114. For example, magnetic sensors, electromagnetic radiation sensors (microbolometer), light sensors, temperature sensors, humidity sensors, stress sensors, strain sensors, and chemical detection sensors could all be utilized in the multifunction sensor device.

In a typical embodiment the MEMS gyroscope 110 comprises a rate gyroscope that generates an output that is proportional to the rate of measured rotation. However, in other embodiments the MEMS gyroscope 110 could comprise a whole angle gyroscope. The MEMS gyroscope 110 includes a first clock signal that is in phase with the mechanical oscillation of the vibrating mass or a sub-harmonic of the mechanical oscillation. As described above, this can be accomplished several methods including the use of a PLL to phase-lock the clock signal to the mechanical oscillation and a clock divider if the first clock signal is a sub-harmonic of the mechanical oscillation. The reset mechanism 114 receives this phase-locked first clock signal, and uses it to generate a reset signal to align the relative periodic phases of the clock signals of the other sensors 112 to the first clock signal. Thus, the MEMS gyroscope 110 and the other sensors 112 will all have clock signals with consistent periodic relative phase alignment. As described above, this reduces the likelihood of multimodal offsets and thus can improve the accuracy of the multifunction sensor device 100.

In one embodiment the reset mechanism 114 receives a reset request signal and is configured to generate a reset signal in response to an edge of the first clock signal being received subsequent the reset request signal. For example, the reset mechanism 114 can be configured to issue a reset pulse aligned with an edge of the first clock signal. Thus, the reset pulse can be issued on the next rising edge of the first clock signal or the next falling edge of the first clock signal.

Figure 2:
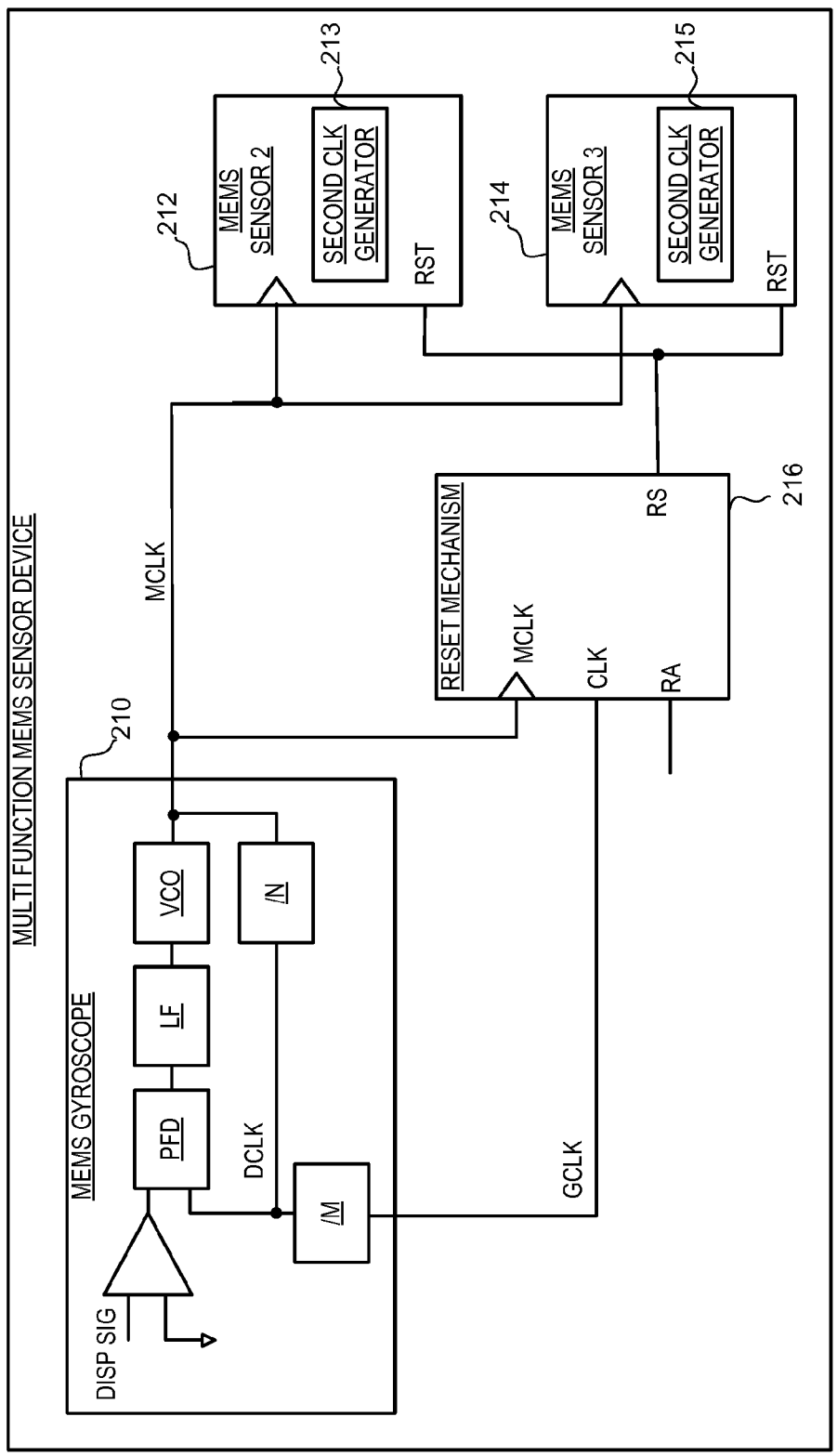
FIG. 2 is a schematic view of multifunction sensing device in accordance with an embodiment of the invention.

Turning now to FIG. 2, a schematic view of a multifunction sensing device 200 is illustrated. The sensing device 200 includes a MEMS gyroscope 210, a second MEMS sensor 212, a third MEMS sensor 214 and a reset mechanism 216.

The MEMS gyroscope 210 generates a high frequency master clock signal (MCLK) that is used as the clock for the other MEMS sensors 212 and 214, making the whole system synchronous. The MEMS gyroscope 210 also generates a clock signal that is synchronous with mechanical displacement (DCLK) and a clock signal that is a sub-harmonic to mechanical displacement (GCLK). In this illustrated embodiment it is the sub-harmonic clock (GCLK) that is the first clock signal provided to the CLK input of the reset mechanism 216. However, in other embodiments the first clock signal can be the displacement clock signal (DCLK) itself. The reset mechanism 216 is configured to generate a reset signal to consistently set the relative periodic phase alignment of the clock signals of the second MEMS sensor 212 and the third MEMS sensor 214 to a first clock signal of the MEMS gyroscope 210. It should again be noted that although the entire system is synchronous due to the use of MCLK in each sensor to generate their own internal clocks, that without the operation of the reset mechanism 216 to ensure the consistent periodic phase alignment of these clock generator circuits relative to one another and to the displacement in the gyroscope, variations in relative phase alignment can occur and cause variation in output offsets. Again, examples of such variations in periodic phase alignment are illustrated in graphs 502, 504 and 506 in FIG. 5.

The master clock signal and first clock signal are both generated using a displacement signal that is in phase with the mechanical oscillation of the vibrating. Specifically, the displacement signal is amplified and passed to a phase frequency detector (PFD) and then to a loop filter (LF) and a voltage controlled oscillator (VCO), thus generating the master clock signal (MCLK). The master clock signal MCLK is fed back to the PFD through an N divider to generate a displacement clock signal (DCLK). This feedback of implements a phase locked loop that phase locks the displacement clock signal to the mechanical oscillation. In this embodiment the displacement clock signal DCLK is also divided again with an M divider to generate a sub-harmonic clock signal (GCLK). In this illustrated embodiment it is the sub-harmonic clock signal (GCLK) that is the first clock signal provided to the reset mechanism 216 at the CLK input. In a typical implementation N has a value on the order of 1000 such that the master clock signal MCLK is approximately three orders of magnitude faster than the vibration frequency of the oscillating mass. Likewise, in a typical implementation M can have a value of greater or equal to 1.

During operation, a reset request signal is provided to the RA input of reset mechanism 216. In response, the reset mechanism 216 generates a reset signal at the RS output that is aligned with an edge of the first clock signal. For example, the RS output generates a reset pulse on the next rising edge of the first clock signal received at the CLK input. The reset pulse is applied to the other MEMS sensor devices 212 and 214. Specifically, the reset pulse is provided to the RST input of the sensor devices 212 and 214 where it will be used to reset the clock generators 213 and 215 inside those sensor devices to generate internal clocks signals whose periodic phases don't vary relative to the displacement of the vibrating mass in the gyroscope or to one another.

As described above, the first clock signal can be a signal that is phased aligned with the mechanical oscillation of the vibrating mass or a sub-harmonic of the mechanical oscillation. Typically, a clock signal that is a sub-harmonic of mechanical oscillation may be used when there is some other circuitry in the MEMS gyroscope that operates at a lower rate than the drive frequency, but is synchronous with the drive. In such cases it may be preferable to synchronize to that lower frequency sub-harmonic signal. For example, in applications where health monitoring signals are generated by dividing the drive clock such a sub-harmonic self-test signal may be used for the first clock signal CLK.

In general, using the lower rate sub-harmonic clock signal has the advantage of reducing the phase variability with other elements of the system. That is, aligning the relative periodic phases of the clocks in the MEMS sensors to a relatively slow sub-harmonic clock will generally result in reduced offset variability. For this reason, in some implementations the first clock signal CLK used may be the slowest clock signal in the MEMS gyroscope that is a sub-harmonic of the signal that is phase-locked to displacement. However it should be noted that using a slower sub-harmonic clock signal can increase the time required to align the relative periodic phases of the clocks and thus increase the start-up time of the MEMS multifunction sensing device. For this reason, it may not always be desirable to use the slowest sub-harmonic clock in the system as the first clock signal CLK, and in those cases a faster sub-harmonic clock can be used.

Figure 3:
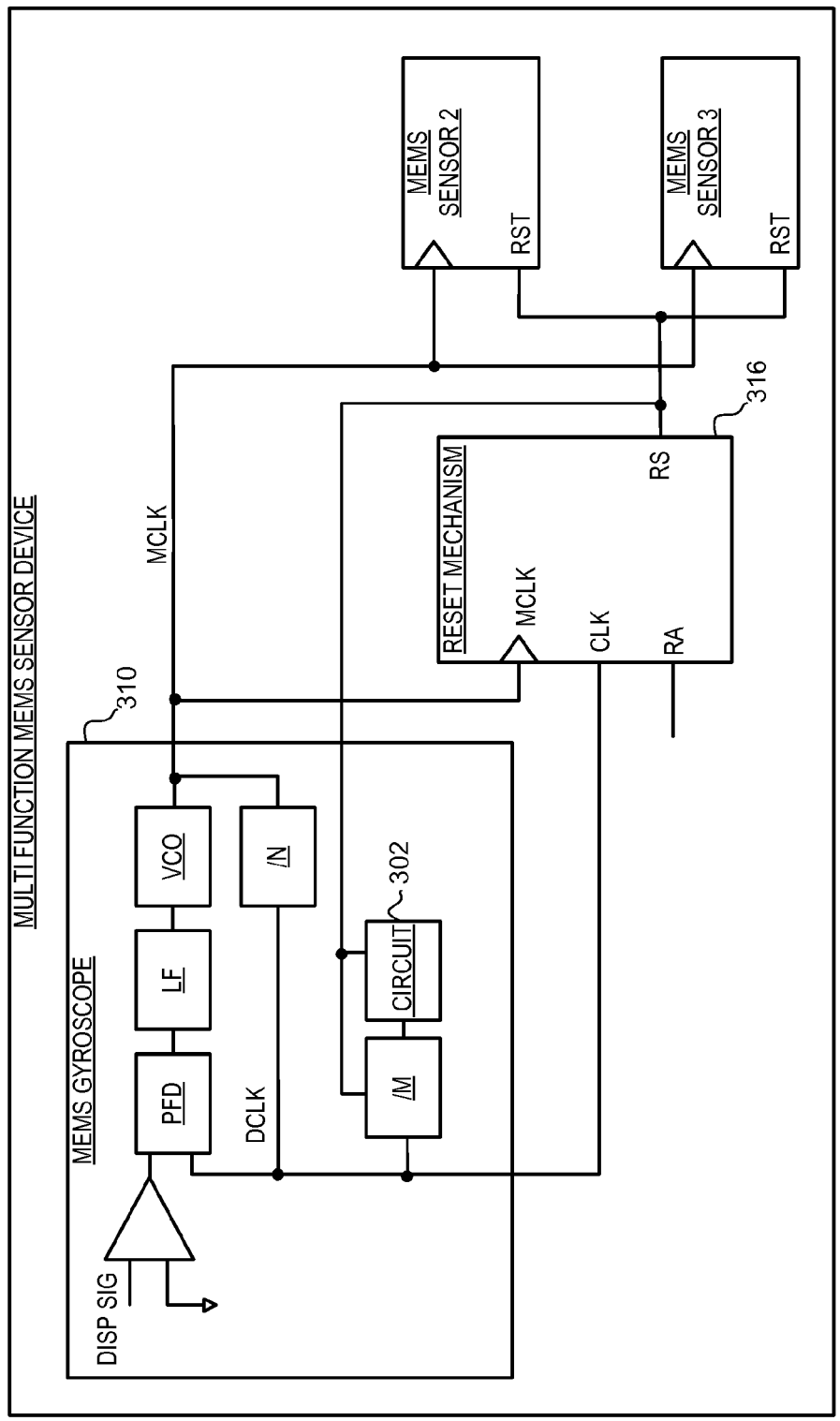
FIG. 3 is a schematic view of multifunction sensing device in accordance with another embodiment of the invention.

Turning now to FIG. 3, a schematic view of a multifunction sensing device 300 is illustrated. In this embodiment the faster displacement clock signal DCLK and reset signal RS are used to avoid the possibility of a long start up time. Also, in this embodiment the MEMS gyroscope 310 includes some internal circuitry (i.e., circuit 302) that runs at a slower operating rate using a sub-harmonic clock. For example, the circuit 302 can comprise internal health monitoring circuitry that necessitates the slower clock speed.

Like the embodiment in FIG. 2 the reset mechanism 316 is configured to generate a reset signal to set the relative periodic phase alignment of the clock signals of the second MEMS sensor and the third MEMS sensor to first clock signal of the MEMS gyroscope 310. As noted above, in this case the first clock signal is the faster displacement clock signal DCLK rather than the slower sub-harmonic GLCK. This reduces the possibility of long delays in device start up. The reset signal is used to reset the electronically resettable circuits, including circuit 302 and the /M divider in the MEMS gyroscope 310. Thus, the whole system is set to have a consistent relative periodic phase alignment using the relative fast displacement clock signal DCLK. This approach thus will reduce the probability of multimodal offsets while decreasing startup time compared to the approach in FIG. 2.

Figure 4:
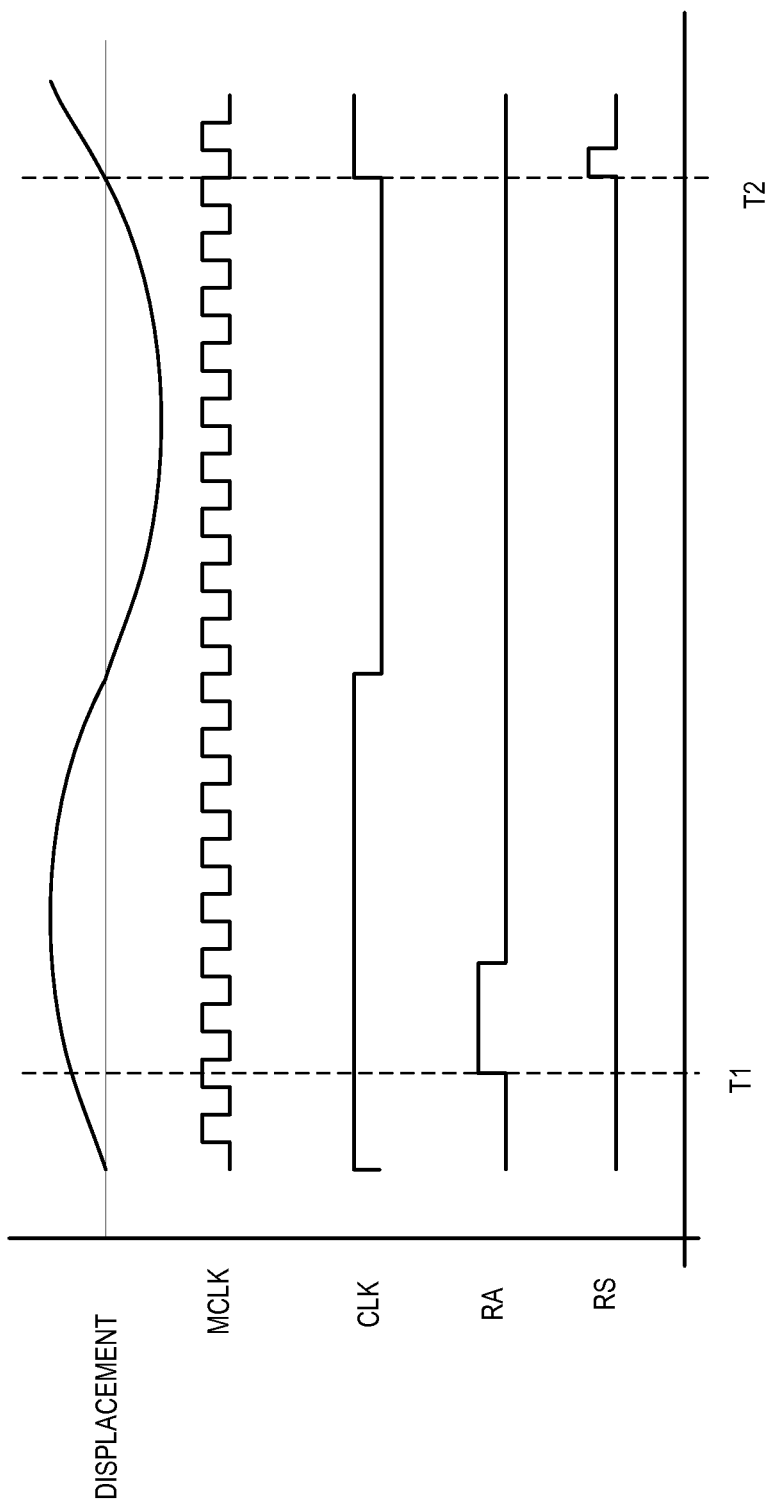
FIG. 4 is a timing diagram illustrating exemplary timing waveforms for an embodiment of the invention.

Turning now to FIG. 4, an exemplary timing diagram 400 for the multifunction device 200 is illustrated. The timing diagram 400 shows portions of waveforms corresponding to the displacement of the vibrating mass in the MEMS gyroscope 210 (labeled DISPLACEMENT), the master clock signal (labeled MCLK), the first clock signal (labeled CLK), the reset request signal (labeled RA) and the reset signal (labeled RS). Note that in this embodiment the first clock signal CLK is phase-locked with the displacement, although in other embodiments the first clock signal will be a sub-harmonic of displacement. Also note that the CLK and MCLK are harmonically related, with CLK being a sub-harmonic of MCLK. As illustrated in FIG. 4, the reset request signal RA is enabled at time T1. In response, the reset mechanism generates the reset signal RS aligned with the next rising edge of the first clock signal CLK. As described above, this reset signal RS can be applied to MEMS sensor devices where it is used to align the relative periodic phases of the clock signals in the MEMS sensor devices to the first clock signal. Specifically, the reset signal RS is used to set the relative periodic phase alignment between the clock signals in the MEMS sensor devices and the first clock signal.

Typically, the RA input is asserted asynchronously, such as from a master state machine. For example, it can be asserted at startup or on command as needed. In either case, the reset mechanism will then generate the reset signal RS on the next rising clock edge of the CLK.

Thus, in one embodiment a multifunction sensing device is provided that comprise: a microelectromechanical (MEMS) gyroscope, the MEMS gyroscope configured to generate a first clock signal; a reset mechanism, the reset mechanism configured to generate a reset signal in response to an edge of the first clock signal; and a second sensor, the second sensor including at least a second clock signal, the second sensor configured to receive the reset signal and to set relative periodic phase alignment between the second clock signal and the first clock signal in response to the reset signal.

In another embodiment a method of operating a multifunction sensing device is provided, where the multifunction sensing device includes a microelectromechanical (MEMS) gyroscope and a second sensor. The method comprises generating a first clock signal in the MEMS gyroscope; and setting relative periodic phase alignment between a second clock signal in the second sensor to the first clock signal.

In another embodiment a sensing device is provided. The sensing device comprises: a microelectromechanical (MEMS) gyroscope, the MEMS gyroscope configured to generate a first clock signal phase-locked to mechanical oscillation in the MEMS gyroscope or to a sub-harmonic of the mechanical oscillation; a reset mechanism, the reset mechanism configured to receive the first clock signal and a reset request signal, and wherein the reset mechanism is configured to generate a reset signal in response to receiving the reset request signal and an edge of the first clock signal subsequent to receiving the reset request signal; a second MEMS sensor, the second MEMS sensor including a second clock signal, and where the second MEMs sensor is selected from the group consisting of: a MEMS inertial sensor and a MEMS pressure sensor, and wherein the second MEMS sensor is configured to receive the reset signal and to set relative periodic phase alignment between the second clock signal and the first clock signal in response to the reset signal; and a third MEMS sensor, the third MEMS sensor including a third clock signal, and where the third MEMS sensor is selected from the group consisting of: a MEMS inertial sensor and a MEMS pressure sensor, and wherein the third MEMS sensor is configured to receive the reset signal and to set relative periodic phase alignment between the third clock signal and the first clock signal in response to the reset signal.

The various embodiments described herein thus provide systems and methods for providing improved multifunction sensing. In these embodiments a multifunction sensing device includes a MEMS gyroscope and at least a second MEMS sensor. The MEMS gyroscope is configured to generate a first clock signal, and the second MEMS sensor includes a second clock signal. The multifunction sensing device further includes a reset mechanism, the reset mechanism configured to generate a reset signal to align the relative periodic phase of the second clock signal to the first clock signal.

Although the preferred embodiments of the invention have been illustrated and described in detail, it will be readily apparent to those skilled in the art that various modifications may be made therein without departing from the spirit of the invention or from the scope of the appended claims. Accordingly, it should be appreciated that the exemplary embodiments are only examples, and are not intended to limit the scope, applicability, or configuration of the invention.

What is claimed is:

1. A multifunction sensing device, the multifunction sensing device comprising:
   a microelectromechanical (MEMS) gyroscope, the MEMS gyroscope configured to generate a first clock signal;
   a reset mechanism, the reset mechanism configured to generate a reset signal in response to an edge of the first clock signal; and
   a second sensor, the second sensor including at least a second clock signal, the second sensor configured to receive the reset signal and to set relative periodic phase alignment between the second clock signal and the first clock signal in response to the reset signal.

2. The multifunction sensing device of claim 1 wherein the MEMS gyroscope additionally generates a master clock signal, and wherein the second sensor generates the second clock signal using the master clock signal such that the master clock signal and the second clock signal are synchronous.

3. The multifunction sensing device of claim 1 wherein the reset signal is additionally coupled to the MEMS gyroscope, and wherein the reset signal is used to reset a circuit that operates at a rate less than a rate of the first clock signal in the MEMS gyroscope.

4. The multifunction sensing device of claim 1 wherein the second sensor comprises a sensor selected from the group consisting of: an inertial sensor and a pressure sensor, a magnetic sensor, an electromagnetic radiation sensor, a light sensor, a temperature sensor, a humidity sensor, a stress sensor, a strain sensor, and a chemical detection sensor.

5. The multifunction sensing device of claim 1 wherein the multifunction sensing device includes a third sensor including a third clock signal, and wherein the third sensor is configured to receive the reset signal and to set relative periodic phase alignment between the third clock signal and the first clock signal in response to the reset signal.

6. The multifunction sensing device of claim 1 wherein the reset mechanism is configured to receive a reset request signal, and wherein the reset mechanism is configured to generate the reset signal in response to the edge of the first clock signal by generating the reset signal in response to the edge of the first clock signal being received subsequent the reset request signal.

7. The multifunction sensing device of claim 1 wherein the first clock signal is phase-locked to mechanical oscillation of the MEMS gyroscope.

8. The multifunction sensing device of claim 1 wherein the first clock signal is a sub-harmonic of a clock which is phase-locked to mechanical oscillation of the MEMS gyroscope.

9. The multifunction sensing device of claim 1 wherein the second sensor is a MEMS sensor, and wherein the MEMS gyroscope and the second sensor are formed on a same substrate.

10. A sensing device, comprising:
    a microelectromechanical (MEMS) gyroscope, the MEMS gyroscope configured to generate a first clock signal phase-locked to mechanical oscillation in the MEMS gyroscope or to a sub-harmonic of the mechanical oscillation;
    a reset mechanism, the reset mechanism configured to receive the first clock signal and a reset request signal, and wherein the reset mechanism is configured to generate a reset signal in response to receiving the reset request signal and an edge of the first clock signal subsequent to receiving the reset request signal;
    a second MEMS sensor, the second MEMS sensor including a second clock signal, and where the second MEMS sensor is selected from the group consisting of: a MEMS inertial sensor and a MEMS pressure sensor, and wherein the second MEMS sensor is configured to receive the reset signal and to set relative periodic phase alignment between the second clock signal and the first clock signal in response to the reset signal; and
    a third MEMS sensor, the third MEMS sensor including a third clock signal, and where the third MEMS sensor is selected from the group consisting of: a MEMS inertial sensor and a MEMS pressure sensor, and wherein the third MEMS sensor is configured to receive the reset signal and to set relative periodic phase alignment between the third clock signal and the first clock signal in response to the reset signal.

11. The sensing device of claim 10 wherein the reset signal is additionally coupled to the MEMS gyroscope, and wherein the reset signal is used to reset a circuit that operates at a rate less than a rate of the first clock signal in the MEMS gyroscope.

12. A method of operating a multifunction sensing device, the multifunction sensing device including a microelectromechanical (MEMS) gyroscope and a second sensor, the method comprising:
    generating a first clock signal in the MEMS gyroscope; and
    setting relative periodic phase alignment between a second clock signal in the second sensor to the first clock signal.

13. The method of claim 12 wherein the second sensor comprises a sensor selected from the group consisting of: an inertial sensor and a pressure sensor, a magnetic sensor, an electromagnetic radiation sensor, a light sensor, a temperature sensor, a humidity sensor, a stress sensor, a strain sensor, and a chemical detection sensor.

14. The method of claim 12 wherein the multifunction sensing device further includes a third sensor, and further comprising setting relative periodic phase alignment between a third clock signal in the third sensor to the first clock signal.

15. The method of claim 12 further comprising resetting a circuit that operates at a rate less than a rate of the first clock signal in the MEMS gyroscope.

16. The method of claim 12 wherein the setting relative periodic phase alignment between the second clock signal in the second sensor to the first clock signal comprises receiving the first clock signal and a reset request signal, and generating a reset signal in response to an edge of the first clock signal received subsequent the reset request signal.

17. The method of claim 12 wherein the first clock signal is phase-locked to mechanical oscillation of the MEMS gyroscope.

18. The method of claim 12 wherein the first clock signal is a sub-harmonic of a clock which is phase-locked to mechanical oscillation of the MEMS gyroscope.

19. The method of claim 12 wherein the setting relative periodic phase alignment between the second clock signal in the second sensor to the first clock signal comprises receiving a master clock signal using the master clock signal to generate the second clock signal.

20. The method of claim 12 wherein the second sensor is a MEMS sensor, and wherein the MEMS gyroscope and the second sensor are formed on a same substrate.

* * * * *